INVENTOR.
BADEN L. COSBY
BY Arthur H. Swanson
ATTORNEY.

May 9, 1967 B. L. COSBY 3,319,242

ELECTRICAL APPARATUS

Original Filed Dec. 6, 1962 2 Sheets-Sheet 2

INVENTOR
BADEN L. COSBY

BY Arthur H. Swanson

ATTORNEY.

United States Patent Office 3,319,242

Patented May 9, 1967

3,319,242
ELECTRICAL APPARATUS

Baden L. Cosby, Norristown, Pa., assignor to Honeywell Inc., a corporation of Delaware Original application Dec. 6, 1962, Ser. No. 242,729. Divided and this application Jan. 17, 1964, Ser. No. 343,436

7 Claims. (Cl. 340—347)

This application is a divisional application of a copending application by Baden L. Cosby, Ser. No. 242,729, filed on Dec. 6, 1962, and subject matter disclosed but not claimed in this application is shown and claimed in the aforesaid copending application of Baden L. Cosby.

This invention relates to data handling apparatus. More specifically, the present invention relates to analog to digital converters.

An object of the present invention is to provide an improved analog to digital converter.

Another object of the present invention is to provide an improved analog to digital converter having a transistorized logic circuit for governing a conversion operation.

A further object of the present invention is to provide an improved self-governing logic circuit for controlling an analog to digital conversion operation.

A still further object of the present invention is to provide an improved analog to digital converter, as set forth herein, having a simplified operation and construction.

In accomplishing these and other objects there has been provided, in accordance with the present invention, an analog to digital converter having a selectively operated reference signal source which is operated by a logic circuit to produce a reference signal substantially equal in amplitude to an unknown signal to be converted. The logic circuit is responsive to a decision amplifier intermittently comparing the unknown signal with the reference signal. The logic circuit is self-governing to increase the reference signal in discrete digital steps by a plurality of tunnel diode gating circuits and to provide a read-out of the amplitude of the reference signal. The logic circuit incorporates means for resetting the reference signal to an initial level in preparation for a new conversion operation.

A better understanding of the present invention may be had by reading the following description in connection with the attached drawings, in which.

Figure 1:
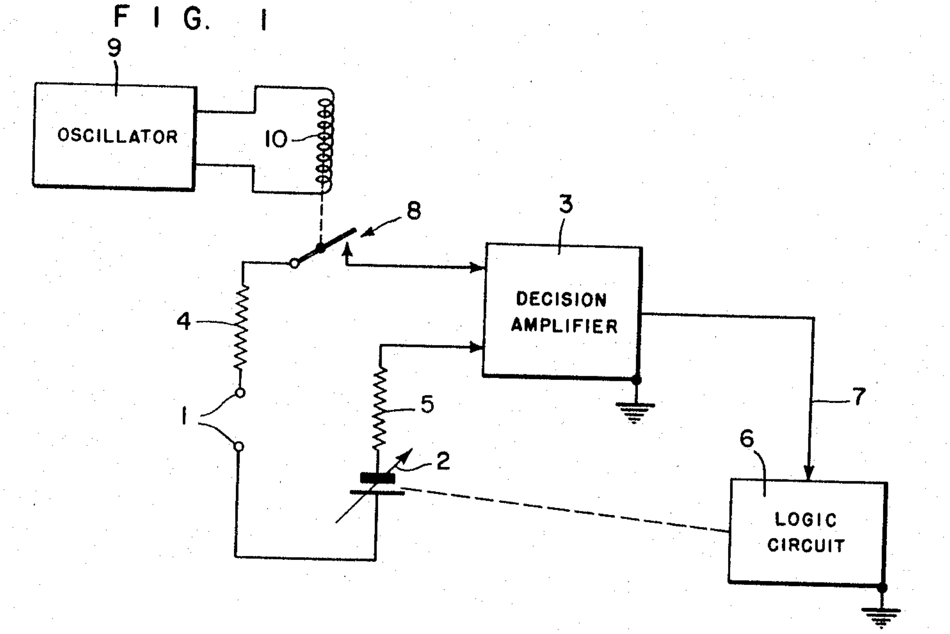
FIG. 1 is a schematic illustration of an analog to digital converter embodying the present invention.

Referring to FIG. 1, there is shown an analog to digital converter embodying the present invention. An unknown potential to be converted is applied to a pair of input terminals 1. The unknown potential is compared with a variable reference potential source 2 by a decision amplifier 3. The amplifier 3 may be any suitable device, such as a differential amplifier, for comparing two input signals to produce an output signal having a polarity representative of the difference of the input signals; i.e., a positive polarity output signal represents a reference signal which is smaller than the unknown signal and vice versa. The unknown potential and the reference potential are isolated from the decision amplifier 3 by respective resistors 4 and 5.

The output signal from the decision amplifier 3 is applied to a logic circuit 6 along a line 7 to control the operation of the reference source 2. The logic circuit 6 is effective to respond to both polarities of the output signal from the amplifier 3 to control reference source 2 to produce a reference signal having a substantial equality with the unknown signal. Thus, an indication of the amplitude of the reference signal may be used as the amplitude indication of the unknown potential. A pair of relay contacts 8 are used to periodically interrupt the application of the unknown potential to the amplifier 3 whereby the output signal from the amplifier 3 is periodically interrupted to produce signal pulses of either positive or negative polarity on the line 7. An oscillator 9 is used to energize a relay coil 10 to operate the contacts 8.

Figure 2:
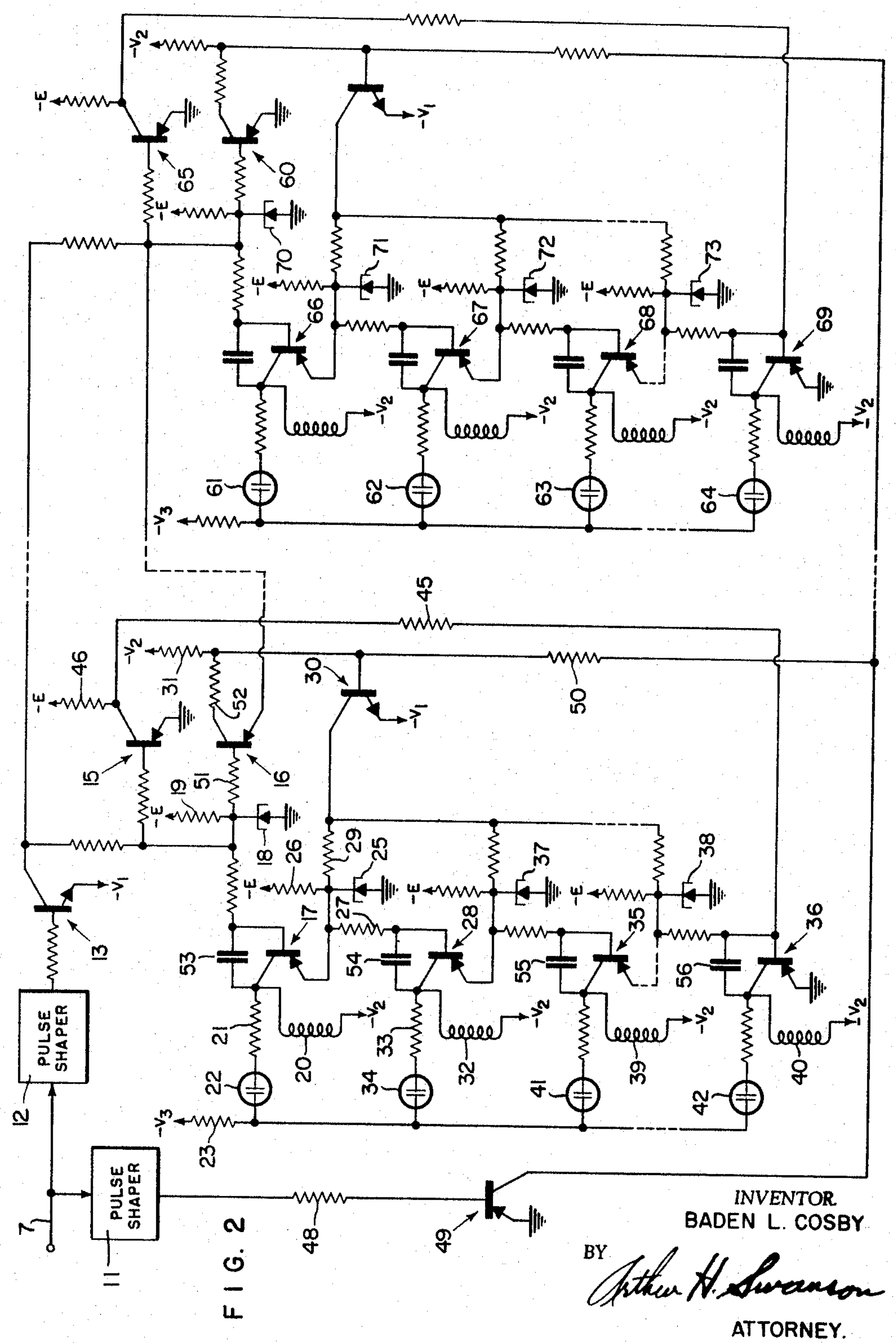
FIG. 2 is a schematic illustration of the logic circuit shown in FIG. 1.

Referring to FIG. 2, there is shown a logic circuit suitable for use in the apparatus of FIG. 1 as logic circuit 6. The input line 7 is connected to a pair of pulse shaper circuits 11 and 12 for shaping positive and negative input pulses, respectively. The positive output signal of the negative pulse shaper 12 is applied to the base electrode of an NPN transistor 13 to render transistor 13 conductive. The output current signal from the transistor 13 is applied to the base electrodes of control transistors (for example, transistors 15 and 16) in similar sub-sections of the circuit 6. These sub-sections, or decades, are each used to control a corresponding order of magnitude of the reference signal. Thus, the first decade may be used to vary the reference signal in steps of ten volts each; e.g., 0 to 90. The succeeding decades would be used to vary the reference signals in decreasing orders of magnitude; e.g., units, tenths, etc. For purposes of this discussion, the schematic of the circuit 6 shown in FIG. 2 is limited to two decades; however, it may be appreciated that the number of decades may be increased without affecting the basic form of the illustrated circuit by simply duplicating the decades or stages, shown in FIG. 2.

In the first decade, the output of transistor 13 is connected to the base circuits of three PNP transistors 15, 16 and 17. A tunnel diode 18 having one electrode, for example the anode, grounded is also connected (at the cathode) to the collector circuit of transistor 13 and is biased from a source —E through resistor 19. The collector circuit of transistor 17 is connected to source $-V_2$ through a relay coil 20. The collector end of the relay coil 20 is also connected through a resistor 21 to one side of a neon indicator light 2. The other side of the light 2 is connected through a common resistor 23 to a source $-V_3$.

The emitter of transistor 17 is connected to the cathode of tunnel diode 25 and, through a resistor 27, to the base of a transistor 28. The cathode of tunnel diode 25 is also connected through a resistor 29 to the collector of a stepping transistor 30. Bias means comprising source —E and resistor 26 are also connected to tunnel diode 25. The emitter of transistor 30 is connected to a source $-V_1$ while the base is connected through a resistor 31 to source $-V_2$. The base electrode of transistor 30 is further connected to the collector electrode of transistor 49 via resistor 50.

The collector of transistor 28 is connected through a relay coil 32 to source $-V_2$ and through a resistor 33 to one side of a neon indicator 34. The other side of the indicator 34 is connected through the resistor 23 to the source $-V_3$. The rest of the first decade is a repetition of the relay coil, tunnel diode, neon indicator, and transistor circuitry described above using additional transistors 35, 36, tunnel diodes 37, 38, relay coils 39, 40 and neon indicators 41, 42. The emitter of the last decade transistor 36 is connected to ground. The base of transistor 36 is connected through resistor 45 to the collector of transistor 15 and to source —E through a resistor 46.

The negative output signal from the positive pulse shaper 11 is applied through a resistor 48 to the base of a PNP transistor 49 to render transistor 49 conductive. The emitter of transistor 49 is connected to ground while the collector is connected through a resistor 50 to the base of transistor 30. The cathode of tunnel diode 18 is also connected through a resistor 51 to the base of transistor 16. The collector of transistor 16 is connected by a resistor 52 and a resistor 31 to the source $-V_2$. The base of transistor 30 is also connected to the junction between resistors 52 and 31. Thus, a relatively negative potential is supplied to the base of transistor 30 and to the collector of transistor 49. Capacitors 53, 54, 55, and 56 are connected between the base and collector electrodes of transistors 17, 28, 35 and 36, respectively, to condition the response of these transistors in the operation of the logic circuit.

The succeeding decades of the logic circuit are substantially similar to the above described decade circuit and are connected thereto at three points. These are the collectors of transistors 13 and 49 and the emitter of transistor 16. The decade shown in FIG. 2 is the last decade of a plurality of decades and differs from the succeeding decades by a ground connection for the emitter of transistor 60 which is the functional equivalent of transistor 16 shown in the first decade. Neon lights 61, 62, 63 and 64 are used as indicators for the last decade. Transistor 65 in the last decade is the functional equivalent of transistor 15 in the first decade. Transistors 66, 67, 68 and 69, used in the last decade to energize the associated relay coils, are controlled by tunnel diodes 70, 71, 72 and 73, respectively.

In operation, the logic circuit 6 of the present invention is arranged to adjust the reference source 2 to provide an initial reference signal which has a maximum amplitude. Thus, all the decades would be set to the last, or nine, position. In this condition, the last transistors in the decades; e.g., transistors 36 and 69, would be in a conducting condition to energize their respective relays. These relays are effective to operate the reference source 2 to produce the largest reference signal available. The reference signal is controlled by the relays in accordance with known techniques. This reference signal is compared with the unknown signal applied to terminals 1. Since the converter of the present invention is to be used with signals having an amplitude smaller than its largest reference signal amplitude, this initial comparison is effective to produce a negative signal on the amplifier output line 7. The relay contacts 8 are effective to periodically interrupt the input to the amplifier 3 in order to convert the aforesaid negative signal to a negative pulse having a predetermined duration. This negative pulse, after inversion by application to pulse shaper 12, is used to supply a current to tunnel diode 18 via transistor 13. That is, pulse shaper 12 operates on the negative pulse supplied thereto such that transistor 13 is rendered conductive in response to the pulse.

The tunnel diode 18 is biased in the bistable mode of operation by a current through resistor 19. However, this current is insufficient to switch the diode 18 from a low voltage state to a high voltage state. The additional current supplied to the cathode of tunnel diode 18 by the negative pulse produced by transistor 13 will switch the tunnel diode along its characteristic curve to its high voltage stable point. The anode of tunnel diode 18 is connected to ground. Therefore, the high voltage produced by tunnel diode 18 is relatively negative in polarity. This high voltage point is sufficient to turn on transistors 15, 16 and 17. Turning on transistor 15 is effective to turn off transistor 36 to terminate the energization of relay coil 40. The deenergization of coil 40 is effective to remove the nine position of the first decade.

For the purpose of this example, assume there are only two decades; e.g., 1 and 10 unit decades. Initially, the reference signal would be 99 units. Removing the 9 position of the 10 unit decade reduces the reference signal to 9 units. Also, the 0 position of the 10 unit decade is turned on by transistor 17 through the relay coil 20. The neon light 22 is turned on to indicate the energization of the 0 position relay coil of the 10 decade. Capacitor 53 is connected across the transistor 17 to control the current rise of the transistor whereby the next tunnel diode 25 is not affected by the setting of the 0 position, or level circuit.

Assume the unknown signal level is 75 units. The above described action will occur on the first comparison by the decision amplifier since the initial 99 unit reference signal is greater than than the unknown. By reducing the 10 unit or tens decade to zero, the reference signal is left at the 9 level supplied by the 1 unit or ones decade. This level is below the unknown level and is effective to produce a positive signal from the amplifier 3. This positive signal is applied to the pulse shaper 11. Pulse shaper 11 operates on the signal applied thereto and is effective to turn on transistor 49. The current signal from transistor 49 is applied to transistor 30. As previously mentioned, the initial negative pulse had turned on transistor 16. The output signal from transistor 16 in combination with the signal from transistor 49 is effective to turn on transistor 30. The output signal from transistor 30 is applied to all the tunnel diodes in the first decade. However, only the second tunnel diode 25 is biased by both the source $-E$ and the signal from the preceding zero level transistor 17. Therefore, the addition of the signal from transistor 30 is effective to switch only tunnel diode 25 to a high voltage state and to turn on the second transistor 28. Additionally, the high voltage state of the tunnel diode 25 balances the high voltage state of tunnel diode 18 to remove the input signal from transistor 17. Accordingly, transistor 17 is turned off as transistor 28 is on, while tunnel diodes 18 and 25 are retained in a high voltage state. This action is effective to turn off the zero level relay coil 20 and to turn on the first level relay coil 32.

The relay coil 32 is arranged to increase the reference signal ten units for an overall reference signal of 19 units. Since this reference signal is still smaller than the unknown, the next pulse from amplifier 3 is still a positive pulse which is effective to switch on the next tunnel diode 37 which has been biased by the source $-E$ and the conducting condition of transistor 28. The switching of tunnel diode 37 is effective to remove the input signal from transistor 28 and supply an input signal to transistor 35 as described above for transistors 17 and 28. Thus, transistor 28 is rendered non-conducting and transistor 35 is switched to the conducting condition. The conducting condition of transistor 35 is effective to turn off relay coil 20 and turn on relay coil 39 thereby to increase the reference signal by twenty units to a level of 29. Thus, the positive stepping pulses applied from transistor 49 via transistor 30 continue to step the first decade by switching succeeding tunnel diodes into a high voltage state until a reference level of 79 units is reached upon the energization of the seventh level of the tens decade.

The 79 units reference signal level is sensed by the amplifier 3 as a larger signal than the unknown signal, and the next pulse from the amplifier 3 is a negative shift pulse. The shift pulse is applied to the cathode of tunnel diode 70 of the next decade via pulse shaper 12 and transistor 13. Tunnel diode 70 has previously been conditioned by bias current signals from the source $-E$ and the transistor 16. With the addition of the current from the negative shift pulse, tunnel diode 70 is switched to a high voltage state. Since both tunnel diodes 70 and 18 are in a high voltage state no effective input signal exists at the base of transistor 16. As a result of this balanced condition, transistor 16 is turned off and the stepping gate transistor 30 is closed to further positive stepping signals. Additionally, the high voltage state of tunnel diode 70 is effective to turn on transistors 60, 65 and 66. Transistor 65, in turn, turns off transistor 69, which is the control transistor for the nine level of the units decade. Transistor 66 turns on the zero level of the units decade to provide a total reference signal of 70 units.

This new reference signal level is effective to produce a positive pulse signal from the amplifier 3. This positive signal is applied as a stepping signal to transistor 30 in the first decade where it has no effect since transistor 16 has been turned off. In the second decade, this stepping pulse, in combination with the on condition of transistor 60, is effective to step the second decade in a manner as described above until a reference signal level of 76 units is reached. At this level, the positive pulse train from amplifier 3 is discontinued and a negative shift pulse is applied from the amplifier 3. This negative shift pulse may be used to energize further decades to increase the accuracy of the analog to digital converter. Since in the example, there are only two decades, this shift pulse has no effect and the neon lights for the 76 unit reference level may be read as an approximate digital representation of the unknown signal.

At the end of the conversion operation, the analog to digital converter may be returned to the previously mentioned initial condition of a nine level for all decades by momentarily removing the —E source from all the tunnel diodes and transistors 15 and 65. The removal of the current bias for the tunnel diodes supplied by the source —E is effective to return all the tunnel diodes to a low voltage state. The low voltage state of the tunnel diodes is effective to turn off transistors 15 and 65 and the relay control transistors in the decades whereby the reference signal is removed from the amplifier 3. When the —E source is restored, the tunnel diodes remain in a low voltage state. However, the —E source is now applied to the bases of the nine level transistors 36 and 69 to turn on the nine level relays for each of the decades. The further operation of the present invention is a repetition of the above described operation.

Thus, it may be seen that there has been provided, in accordance with the present invention, an analog to digital converter having a self-governing logic-circuit for controlling the analog to digital conversion operation.

What is claimed is:

1. In combination, variable voltage source means, comparator means connected between said variable voltage source means and a source of unknown voltage, said comparator means producing different signals to indicate the relative values of the voltage produced by each of said sources, logic circuit means for operating on said signals produced by said comparator means to control said variable voltage source means, said logic circuit means including a plurality of switching means comprising a transistor and an associated tunnel diode, said tunnel diode exhibiting one voltage state in response to one signal from said comparator means, said tunnel diode exhibiting a different voltage state in response to a further signal from said comparator means, said transistor being rendered conductive or not in accordance with the voltage state of said associated tunnel diode, and indicator means associated with each transistor to indicate the conduction state of the transistor.

2. The combination recited in claim 1, including switching means for selectively interrupting the connection between said unknown voltage source means and said comparator means.

3. The combination recited in claim 1 wherein said plurality of switching means is connected to said variable voltage source means for selectively changing the voltage level produced thereby, first and second control circuit means selectively operated by different ones of said different signals produced by said comparator means, said first control circuit means operative to cause the switching of at least one of said plurality of switching means in response to the application of one of said different signals thereto, said second control circuit means operative to cause the switching of at least one of said plurality of switching means in response to the application of a different one of said different signals thereto.

4. An analog to digital converter comprising, a selectively controlled reference signal means for producing a variable reference signal by selectively adding signal stages, each of said stages being individually variable in steps, decision amplifier means operative to compare said reference signal with an unknown signal to be converted logic circuit means operative to control said reference signal means in response to an output signal from said decision amplifier means, said logic circuit means including a plurality of control means, first control means operative to preset said reference signal means to produce an assigned reference signal, second control means operative to successively switch each signal stage to a predetermined amplitude level in a sequence in response to an output signal from said decision amplifier, third control means operative to change the amplitude of the stage exhibiting the predetermined amplitude level until the reference signal has a critical amplitude relative to said unknown signal before switching the succeeding stage to a predetermined amplitude level, said control circuits each comprising an actuating means for each step in said stages, individual transistor means controlling an energizing current for each of said actuating means, separate tunnel diode means arranged to apply a control signal to each said transistor means representative of a predetermined voltage state in said tunnel diode means, stepping means responsive to said output signal from said decision amplifier for selectively switching each said tunnel diode means to a predetermined voltage state, and shifting means responsive to said output signal from said decision amplifier to selectively shift said output signal from one of said control circuits to another of said control circuits upon the occurrence of a reference signal having a critical amplitude relative to that of the unknown signal to be converted.

5. An analog to digital converter as set forth in claim 4 wherein said tunnel diode means includes circuit means operative to connect each tunnel diode means as a current return path for said energizing current from one of said transistor means controlled by a preceding one of said tunnel diode means.

6. In combination, variable voltage source means, comparator means connected between said variable voltage source means and a source of unknown voltage, said comparator means producing different signals to indicate the relative values of the voltage produced by each said source, and logic circuit means for operating on said signals produced by said comparator means to control said variable voltage source means, said logic circuit means comprising, separate means for receiving and operating upon said different signals produced by said comparator means, a plurality of separate switching sections, each of said switching sections comprising a plurality of transistor circuit means, first and second control transistor circuit means respectively connected to a different one of said separate means, said first control transistor circuit means producing an output therefrom in response to an input thereto in order to select one of said switching sections, said second control transistor circuit means being operative to provide an output signal therefrom in response to an input signal thereto in order to selectively activate the transistors in the switching section which is selected by said first control transistor circuit means, tunnel diode means connected to each transistor in said switching section, said tunnel diode means being selectively switched from one voltage state to another voltage state in response to the application thereto of a signal from said first and second transistor control circuit means, each tunnel diode being operative to render the switching section transistor associated therewith conductive when switched to one of said voltage states, each of said tunnel diodes being operative to render the preceding switching section transistor non-conductive when said tunnel diode exhibits said one voltage state, and means connecting each of said switching section transistors to said variable voltage source means in order to selectively vary the voltage level produced by said variable voltage source.

7. The combination recited in claim 6 including interstage coupling transistor means connected between the switching sections in order to assure that only one section at a time can be operated on by said first control transistor circuit means, setting transistor circuit means connected to said first transistor control circuit means to set said switching section at one extremity thereof while decoupling the opposite end of the switching section whereby the sequential selection of said transistors in said switching section proceeds in a predetermined manner, and decoupling transistor circuit means connected to said interstage coupling transistor circuit means and said second transistor control circuit means and operative to select a switching section transistor only when each of said second control transistor means and said interstage coupling transistor means are in a predetermined condition.

References Cited by the Examiner

UNITED STATES PATENTS 2,940,071 6/1960 Kindred ------------ 340—347

DARYL W. COOK, *Primary Examiner.*

MAYNARD R. WILBUR, W. J. KOPACZ, *Assistant Examiners.*